United States Patent [19]

Pond

[11] 4,006,424
[45] Feb. 1, 1977

[54] WIDE BANDWIDTH CRYSTAL FREQUENCY DISCRIMINATOR CIRCUIT

[75] Inventor: Charles W. Pond, Costa Mesa, Calif.

[73] Assignee: Hughes Aircraft Company, Culver City, Calif.

[22] Filed: Feb. 9, 1976

[21] Appl. No.: 656,225

[52] U.S. Cl. .................................. 329/117; 329/118
[51] Int. Cl.² .......................................... H03D 3/16
[58] Field of Search ........... 329/117, 118; 325/349; 328/140, 141; 307/233 R

[56] References Cited
UNITED STATES PATENTS

| | | | |
|---|---|---|---|
| 2,397,841 | 4/1946 | Crosby | 329/118 |
| 3,108,230 | 10/1963 | Hurtig | 325/349 X |
| 3,585,513 | 6/1971 | Lucas | 329/117 |

Primary Examiner—Siegfried H. Grimm
Attorney, Agent, or Firm—Paul M. Coble; W. H. MacAllister

[57] ABSTRACT

Frequency discriminators are disclosed employing a crystal filter having a predetermined voltage versus frequency characteristic including a discriminator operating portion slightly below the filter lower cutoff frequency along which the voltage varies substantially linearly as a function of frequency. Detector circuitry rectifies the output voltage from the crystal filter, while voltage level shifting circuitry algebraically combines the output voltage from the detector with a dc voltage such that the algebraic sum of the dc voltage and the detector output voltage is zero when the instantaneous frequency of the input signal to the discriminator is at the discriminator center frequency. The discriminator is constructed without the use of any crystal resonator having a series resonant frequency within the discriminator passband; hence spurious series resonances occur outside of the discriminator passband, thereby facilitating wideband operation.

6 Claims, 6 Drawing Figures

WIDE BANDWIDTH CRYSTAL FREQUENCY DISCRIMINATOR CIRCUIT

This invention relates generally to the detection of frequency modulated signals, i.e. the conversion of an ac signal into a dc signal having a value indicative of the frequency of the ac signal. More particularly, the invention relates to a crystal frequency discriminator circuit of substantially increased bandwidth.

Frequency discriminator circuits employing piezoelectric crystals as frequency sensitive impedance elements have been useful in many applications on account of their good stability, high sensitivity and low power dissipation. In the past such discriminator circuits were designed with at least one piezoelectric crystal resonator having a series resonant frequency below the center frequency of the discriminator and usually in the vicinity of the discriminator lower cutoff frequency. Since practical crystal resonators have spurious resonances at frequencies higher than the desired resonant frequency, prior art crystal discriminators had to be designed with a sufficiently limited bandwidth so that the discriminator upper cutoff frequency would lie below the lowest spurious resonant frequency. As a result, frequency discriminators employing AT crystal resonators had useable bandwidths restricted to about 100 KHz to 150 KHz, while the useable bandwidth of discriminators employing overtone AT crystal resonators was only about 50 KHz.

It is an object of the present invention to provide a crystal frequency discriminator having a bandwidth substantially wider than crystal frequency discriminators of the prior art, while retaining the good stability, high sensitivity and low power dissipation achievable with crystal discriminators.

It is a further object of the invention to provide a crystal frequency discriminator which may be constructed using fewer crystals than otherwise comparable crystal discriminators of the prior art.

A frequency discriminator according to the invention includes input circuitry for receiving a frequency modulated input signal. A crystal filter coupled to the input circuitry has a predetermined voltage versus frequency characteristic including a portion wherein the voltage varies substantially linearly as a function of frequency. The filter includes a crystal resonator having a series resonant frequency at a frequency higher than the frequencies corresponding to the substantially linear portion of the voltage versus frequency characteristic. Detector circuitry coupled to the crystal filter rectifies the output voltage from the crystal filter. Voltage level shifting circuitry coupled between the input circuitry and the detector algebraically combines the output voltage from the detector with a dc voltage such that the algebraic sum of the dc voltage and the output voltage from the detector is zero when the instantaneous frequency of the input signal is at the discriminator center frequency. Since a frequency discriminator according to the invention is constructed without the use of any crystal resonator having a series resonant frequency within the discriminator passband, spurious series resonances occur outside of the discriminator passband, and hence are not troublesome.

Additional objects, advantages and characteristic features of the invention will become readily apparent from the following detailed description of preferred embodiments of the invention when considered in conjunction with the accompanying drawings wherein.

Figure 1:
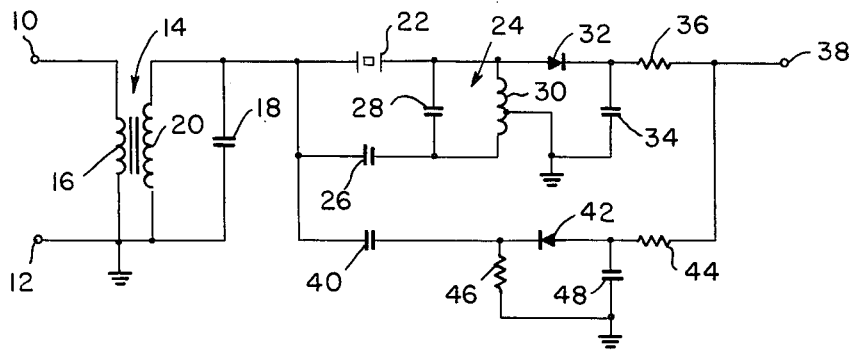
FIG. 1 is a schematic circuit diagram of a frequency discriminator circuit according to one embodiment of the invention.

Referring to FIG. 1 with greater particularity, a frequency discriminator circuit according to the invention may be seen to include a pair of input terminals 10 and 12 between which a frequency modulated rf input signal is applied. The terminal 12 may be connected to a level of reference potential illustrated as ground. A transformer 14 has its primary winding 16 connected between input terminals 10 and 12, while a capacitor 18 is connected across secondary winding 20 of transformer 14.

A crystal resonator 22 is connected between the ungrounded end of secondary winding 20 and one end of a tank circuit 24, while a capacitor 26 is connected between the ungrounded end of winding 20 and the other end of tank circuit 24. As a specific example, crystal resonator 22 may be formed from an AT-cut quartz crystal, although crystals of other materials and other cuts are also suitable and may be employed instead. Tank circuit 24 includes a parallel-connected capacitor 28 and inductor 30, the latter having a grounded center tap. A diode 32 and a capacitor 34 are connected in series between the resonator-connected end of tank circuit 24 and ground, with the cathode of diode 32 connected to capacitor 34. A resistor 36 is connected between the junction between diode 32 and capacitor 34 and a terminal 38 from which the dc output voltage from the discriminator may be obtained.

Connected in series between the ungrounded end of secondary winding 20 and output terminal 38 are a capacitor 40, a diode 42 and a resistor 44, with the cathode of diode 42 connected to capacitor 40. A resistor 46 is connected between ground and the junction between capacitor 40 and diode 42, while a capacitor 48 is connected between ground and the junction between diode 42 and resistor 44.

Transformer 14, capacitors 18 and 26, crystal resonator 22 and tank circuit 24 function as a crystal filter having a predetermined voltage versus frequency characteristic including a portion wherein the voltage varies substantially linearly as a function of frequency. Diode 32, capacitor 34 and resistor 36 function as a detector circuit which eliminates negative voltage excursions from the crystal filter output. Diode 42, capacitors 40 and 48 and resistors 44 and 46 provide a level shifting circuit which derives a dc voltage from the rf input voltage and adds the proper dc level to the detected crystal filter output so that a zero dc output voltage is obtained from the discriminator at the discriminator center frequency.

Figure 2A:
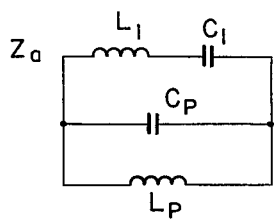
FIGS. 2a and 2b are simplified equivalent circuit diagrams illustrating respective lattice arm impedances for the circuit of FIG. 1.
Figure 2B:
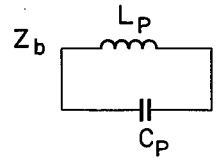

In order to facilitate understanding of the operation of the discriminator circuit of FIG. 1, simplified equivalent circuit diagrams for respective lattice arm impedances $Z_a$ and $Z_b$ in the crystal filter portion of the discriminator are presented in FIGS. 2a and 2b, respectively. In FIG. 2a, $L_1$ and $C_1$ represent the series, or motional, inductance and capacitance, respectively, of the crystal resonator 22. In FIGS. 2a and 2b, $L_p$ represents twice the inductance of secondary winding 20 and twice the inductance of each portion of inductor 30 from the center tap to the respective ends of tank circuit 24, while $C_p$ represents the equivalent parallel combination of the capacitance of capacitors 18, 26 and 28 and the static capacitance of crystal resonator 22.

The impedances $Z_a$ and $Z_b$ may be expressed as a function of the applied frequency $\omega$ by the following equations:

$$Z_a = \frac{\omega^2(\omega^2 - \omega_0^2)}{j\omega C_p(\omega^2 - \omega_1^2)(\omega^2 - \omega_2^2)} \quad (1)$$

$$Z_b = \frac{j\omega}{C_p(\omega_0^2 - \omega^2)} \quad (2)$$

where $\omega_0$ is defined by:

$$\omega_0^2 = \frac{1}{L_1 C_1} = \frac{1}{L_p C_p} \quad (3)$$

and $\omega_1$ and $\omega_2$ represent the lower and upper cutoff frequencies, respectively, of the crystal filter portion of the discriminator.

Figure 3:
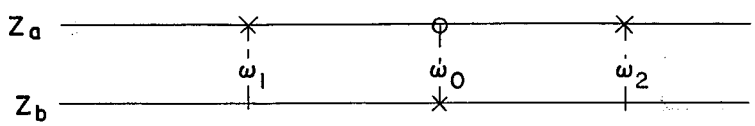
FIG. 3 shows pole-zero plots for the impedances of FIGS. 2a and 2b.

The manner in which the impedances $Z_a$ and $Z_b$ vary as a function of frequency may be better appreciated by making reference to the pole-zero plots shown in FIG. 3 for positive values of the frequency $\omega$. From Equation (1) and FIG. 3 it may be observed that the impedance $Z_a$ has poles (i.e., parallel resonances) at the frequencies $\omega_1$ and $\omega_2$ and a zero (i.e., series resonance) at $\omega_0$, while from Equation (2) and FIG. 3 it becomes apparent that the impedance $Z_b$ possesses a zero at $\omega_0$.

The frequencies $\omega_0$, $\omega_1$ and $\omega_2$ at which the poles and zeros shown in FIG. 3 occur are selected according to the desired voltage versus frequency characteristic of the discriminator. A specific exemplary plot illustrating the output voltage E appearing at terminal 38 versus the frequency $\omega$ for the circuit of FIG. 1 is shown by curve 50 of FIG. 4. It may be seen from the curve 50 that the crystal filter portion of the discriminator circuit is designed as a bandpass filter having a center frequency at $\omega_0$ and a bandwidth $BW_f$ ranging from lower cutoff frequency $\omega_1$ to upper cutoff frequency $\omega_2$. As a specific example, the frequencies $\omega_1$ and $\omega_2$ may be those frequencies at which the output voltage E is 3 db below its value at the center frequency $\omega_0$.

Figure 4:
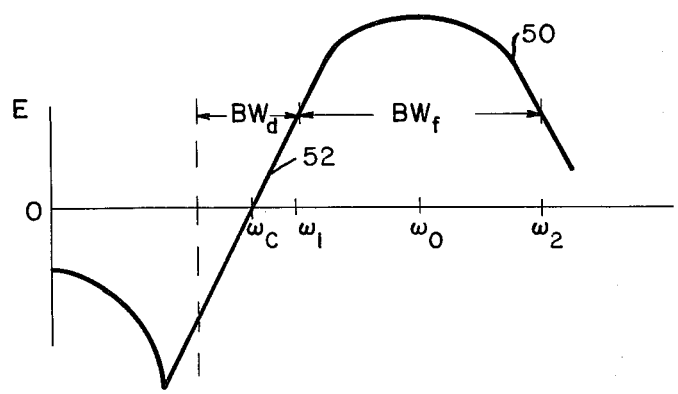
FIG. 4 is a graph illustrating the output voltage as a function of frequency for the circuit of FIG. 1.

It may further be seen from FIG. 4 that the voltage versus frequency characteristic 50 includes a portion 52 slightly below the filter lower cutoff frequency $\omega_1$ along which the voltage E varies substantially linearly as a function of the frequency $\omega$, and it is this portion 52 of the curve 50 which is used to produce frequency discrimination. The center frequency $\omega_c$ of the discriminator, i.e., the frequency at which the discriminator output voltage E is zero, occurs at a preselected frequency below the filter lower cutoff frequency $\omega_1$. In the specific exemplary arrangement depicted by curve 50 of FIG. 4, the discriminator center frequency $\omega_c$ corresponds to that point on the curve 50 for which the filter response is 6 db below its value at the filter center frequency $\omega_0$. The bandwidth of the discriminator $BW_d$ is such that the discriminator upper cutoff frequency occurs in the vicinity of the filter lower cutoff frequency $\omega_1$. Although in the specific exemplary arrangement illustrated, the discriminator upper cutoff frequency coincides with the filter lower cutoff frequency $\omega_1$, these two frequencies need not be equal. In fact, the filter lower cutoff frequency $\omega_1$ will often lie slightly below the discriminator upper cutoff frequency, especially when "intermediate band" filter design techniques are employed.

As an illustrative example, a discriminator according to FIG. 1 and employing a "wide band" filter design may be constructed using the specific parameter values listed below in the Table I. It should be understood, of course, that these parameter values are given solely for purpose of illustration, and a wide range of other parameter values are also suitable.

Figure 5:
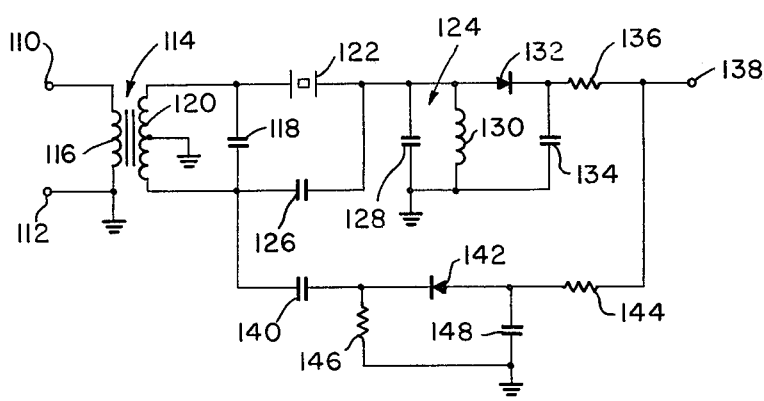
FIG. 5 is a schematic circuit diagram of a frequency discriminator circuit according to another embodiment of the invention.

TABLE I $\omega_c = 30$ MHz
$BW_d = 300$ KHz
$\omega_0 = 30.75$ MHz
$BW_f = 1200$ KHz
$\omega_1 = 30.15$ MHz
$\omega_2 = 31.35$ MHz Another embodiment of the invention is illustrated in FIG. 5. Components in the embodiment of FIG. 5 which correspond to respective components in the embodiment of FIG. 1 are designated by the same second and third reference numeral digits as their counterpart components in FIG. 1, along with the addition of a prefix numeral "1." The circuit of FIG. 5 differs from that of FIG. 1 in that secondary winding 120 of transformer 114 has a grounded center tap, while the end of tank circuit 124 electrically remote from crystal resonator 122 is connected to the ground level.

Since a frequency discriminator circuit according to the invention is constructed without the use of any crystal resonator having a series resonant frequency within the discriminator passband $BW_d$, spurious series resonances occur outside of the discriminator passband, and hence are not troublesome. Therefore, a frequency discriminator according to the invention is able to provide a useable bandwidth substantially wider than crystal frequency discriminators of the prior art. In addition, a frequency discriminator circuit according to the invention may be constructed using fewer crystals than otherwise comparable crystal frequency discriminators of the past. In fact, only a single crystal 22 or 122 (as shown in FIGS. 1 and 5, respectively) need be employed, although additional crystals may be added in parallel with the crystals 22 or 122 in order to enhance the linearity of the discriminator voltage versus frequency characteristic.

Thus, while the invention has been shown and described with reference to particular embodiments, various changes and modifications which are obvious to a person skilled in the art to which the invention pertains are deemed to lie within the spirit, scope and contemplation of the invention.

What is claimed is:

1. A discriminator circuit for providing a unidirectional output voltage indicative of the instantaneous frequency deviation of a frequency modulated input signal from a center frequency comprising:

input circuit means for receiving said frequency modulated input signal;

crystal filter means coupled to said input circuit means and having a predetermined voltage versus frequency characteristic including a portion wherein the voltage varies substantially linearly as a function of frequency, said crystal filter means including a crystal resonator having a series resonant frequency at a frequency higher than the frequencies corresponding to said substantially linear portion of said voltage versus frequency characteristic;

detector circuit means coupled to said crystal filter means for rectifying the output voltage from said crystal filter means; and voltage level shifting means coupled between said input circuit means and said detector circuit means for algebraically combining the output voltage from said detector circuit means with a dc voltage such that the algebraic sum of said dc voltage and said output voltage from said detector circuit means is zero when the instantaneous frequency of said input signal is at said center frequency.

2. A discriminator circuit according to claim 1 wherein said voltage versus frequency characteristic has a maximum voltage value substantially at said series resonant frequency, and said crystal filter means has first and second parallel resonant frequencies respectively less than and greater than said series resonant frequency such that the voltage value of said voltage versus frequency characteristic at said first and second parallel resonant frequencies is less than said maximum voltage value by a predetermined amount.

3. A discriminator circuit according to claim 2 wherein said first parallel resonant frequency is greater than said center frequency and corresponds to a voltage value along said substantially linear portion of said voltage versus frequency characteristic.

4. A discriminator circuit according to claim 2 wherein said crystal filter means has a third parallel resonant frequency at a frequency substantially equal to said series resonant frequency.

5. A frequency discriminator circuit comprising:
an input terminal, an output terminal and a reference terminal;
a transformer having a primary winding and a secondary winding, said primary winding being coupled between said input terminal and said reference terminal, said secondary winding having one terminal coupled to said reference terminal, a first capacitor coupled across said secondary winding;
a second capacitor and an inductor coupled in parallel, said inductor having a tap coupled to said reference terminal, a crystal resonator coupled between another terminal of said secondary winding and one terminal of said inductor, a third capacitor coupled between said another terminal of said secondary winding and another terminal of said inductor;
a first diode and a first resistor coupled in series between said one terminal of said inductor and said output terminal, a fourth capacitor coupled between said reference terminal and the junction between said first diode and said first resistor;
a fifth capacitor, a second diode, and a second resistor coupled in series between said another terminal of said secondary winding and said output terminal, a third resistor coupled between said reference terminal and the junction between said fifth capacitor and said second diode, and a sixth capacitor coupled between said reference terminal and the junction between said second diode and said third resistor.

6. A frequency discriminator circuit comprising:
an input terminal, an output terminal and a reference terminal;
a transformer having a primary winding and a secondary winding, said primary winding being coupled between said input terminal and said reference terminal, said secondary winding having a tap coupled to said reference terminal, a first capacitor coupled across said secondary winding;
a second capacitor and an inductor coupled in parallel, one terminal of said inductor being coupled to said reference terminal, a third capacitor coupled between one terminal of said secondary winding and another terminal of said inductor, a crystal resonator coupled between another terminal of said secondary winding and said another terminal of said inductor;
a first diode and a first resistor coupled in series between said another terminal of said inductor and said output terminal, a fourth capacitor coupled between said reference terminal and the junction between said first diode and said first resistor;
a fifth capacitor, a second diode, and a second resistor coupled in series between said one terminal of said secondary winding and said output terminal, a third resistor coupled between said reference terminal and the junction between said fifth capacitor and said second diode, and a sixth capacitor coupled between said reference terminal and the junction between said second diode and said third resistor.

* * * * *